United States Patent [19]
Regnier

[11] Patent Number: 5,360,346
[45] Date of Patent: Nov. 1, 1994

[54] ELECTRICAL CONNECTOR ASSEMBLY WITH PRINTED CIRCUIT BOARD STIFFENING SYSTEM

[75] Inventor: Kent E. Regnier, Lombard, Ill.
[73] Assignee: Molex Incorporated, Lisle, Ill.
[21] Appl. No.: 173,597
[22] Filed: Dec. 22, 1993
[51] Int. Cl.[5] .......................................... H01R 13/658
[52] U.S. Cl. ...................................... 439/61; 439/608
[58] Field of Search ................. 439/61, 101, 108, 631, 439/608

[56] References Cited

U.S. PATENT DOCUMENTS

| | | | |
|---|---|---|---|
| 3,871,728 | 3/1975 | Goodman | 339/14 R |
| 4,452,359 | 6/1984 | Koppensteiner | 211/41 |
| 4,533,978 | 8/1985 | Walter | 361/419 |
| 4,952,172 | 8/1990 | Barkus et al. | 430/532 |
| 4,973,270 | 11/1990 | Billman et al. | 439/630 |
| 4,988,577 | 1/1991 | Jamieson | 428/573 |
| 5,030,115 | 7/1991 | Regnier et al. | 439/108 |
| 5,186,377 | 2/1993 | Rawson et al. | 228/37 |
| 5,198,279 | 3/1993 | Beinhaur et al. | 428/99 |
| 5,238,414 | 8/1993 | Yaegashi et al. | 439/108 |
| 5,263,870 | 11/1993 | Billman et al. | 439/108 |

*Primary Examiner*—Gary F. Paumen
*Attorney, Agent, or Firm*—Charles S. Cohen

[57] ABSTRACT

An electrical connector assembly is provided for mounting on a printed circuit board. The assembly includes an elongated housing having a mother board-mounting face and a daughter board-receiving face. A pair of generally parallel slots extend lengthwise of the housing in the board-receiving face for receiving a pair of daughter boards. A plurality of terminal-receiving passages are provided along the housing in proximity to each slot. A plurality of terminals are received in the passages, and each terminal has a contact section for engaging a circuit on the respective daughter board received in the respective slot. An elongated stiffening bar is disposed within the elongated housing between the pair of slots therein. The bar is rigid in a direction generally perpendicular to the mother board mounted to the board-mounting face of the housing. Stiffening bar includes a plurality of feet for securing the bar to the mother board and thereby preventing warping thereof. The stiffening bar is press fit into a third slot in the board-mounting face of the housing such that the housing and the stiffening bar can be conjointly mounted to the mother board in a single assembly step.

19 Claims, 3 Drawing Sheets

ELECTRICAL CONNECTOR ASSEMBLY WITH PRINTED CIRCUIT BOARD STIFFENING SYSTEM

FIELD OF THE INVENTION

This invention generally relates to the art of electrical connectors and, particularly, to an electrical connector assembly for mounting on a printed circuit board, the assembly including a board stiffening system.

BACKGROUND OF THE INVENTION

A typical electrical connector assembly for mounting on a printed circuit board includes a dielectric housing having a board-mounting face and a mating face, with a plurality of terminal-receiving passages extending between the faces. A plurality of terminals are received in the passages, and each terminal includes a contact section near the mating face for interengagement with a contact of a complementary mating electrical apparatus and a tail section projecting from the housing toward the printed circuit board for termination to circuit traces on the board, usually by soldering processes.

A specific type of board mounted electrical connector assembly is designed for interconnection between a first printed circuit board and one or more second printed circuit boards. The assembly is permanently mounted on or terminated to the first printed circuit board which commonly is called the "mother" board. The assembly removably receives the one or more second printed circuit boards which commonly are called the "daughter" boards. The housings for such connector assemblies are considerably elongated to accommodate an edge of the daughter board(s). Typically, the housing includes one or more slots extending lengthwise thereof, whereby the mating face of the housing forms a board-receiving face of the connector. Of course, there are other types of considerably elongated electrical connector assemblies which create certain problems as outlined below.

Specifically, the problem of printed circuit board warpage or bending is a continuing problem experienced in both the manufacture and use of printed circuit boards having elongated connectors mounted thereto. Warpage is less problematic with short or box-like connectors or components. During manufacturing processes, such as conventional soldering techniques, the printed circuit board and components and connectors are subjected to very high temperatures. Consequently, the boards are known to warp to some extent as a result of such high temperatures. Warpage or bending of a board can reduce the assurance of proper electrical connections between the connector terminals and the circuits on the board. Warpage also can interfere with placement of a plurality of circuit boards in closely spaced arrays and can even result in short circuiting between boards. As a result, warpage can and does result in costly scrapping of many circuit boards after circuit components have been connected in place. Warped boards can be difficult or impossible to insert in pre-designed racks, and, even if successfully inserted, the boards may bulge laterally to an extent that the circuit components thereon come into contact with components on a closely spaced adjacent board, ruining expensive electrical equipment.

Even during use, thin printed circuit boards can bend simply because of the weight placed on the boards or by other extraneous pressures. Again, the bent boards can damage the interconnections between the boards and the electrical components and/or connectors mounted thereon, or the boards may short circuit with adjacent closely spaced boards.

The most common expedient for eliminating the problem of printed circuit board warpage or bending is to provide "board stiffeners" which are rigid in a direction generally perpendicular to the plane of the board. In essence, these separate board stiffeners act as common mechanical support members secured to the board, such as with I-beams or L-beams in mechanical structures. Examples of separate circuit board stiffening devices or brackets are shown in U.S. Pat. Nos. 4,452,359, dated Jun. 5, 1984; 4,533,978, dated Aug. 6, 1985; 4,952,172, dated Aug. 28, 1990; 4,988,577, dated Jan. 29, 1991; 5,186,377, dated Feb. 16, 1993; and 5,198,279, dated Mar. 30, 1993.

The use of separate board stiffening devices, in turn, create other problems in the manufacture and use of printed circuit board connector systems. For instance, the separate board stiffeners use a considerable amount of valuable board "real estate" which otherwise could be used for mounting other circuit components. This creates a critical problem with the ever-increasing miniaturization of electronic circuitry. In addition, the fact that the stiffeners comprise separate mechanical components which must be mounted on and secured to the board, separate manufacturing steps are required in fabricating the circuit board assembly which, in turn, increases the manufacturing costs.

The present invention is directed to providing a printed circuit board stiffening system which solves the problems described above without using any additional printed circuit board real estate and without requiring any separate manufacturing or assembling steps in mounting the board stiffener(s) to the printed circuit board.

SUMMARY OF THE INVENTION

An object, therefore, of the invention is to provide a new and improved board stiffening system in an elongated electrical connector assembly mounted on a printed circuit board.

In the exemplary embodiment of the invention, the electrical connector assembly includes an elongated housing having a board-mounting face and a plurality of terminal-receiving passages. A plurality of terminals are received in the passages. The board stiffening system includes an elongated stiffening bar secured within the elongated housing such that the housing and the stiffening bar can be conjointly mounted to a printed circuit board in a single assembly step. The stiffening bar is rigid in a direction generally perpendicular to the printed circuit board, and means are provided on the bar for securing the bar to the printed circuit board to prevent warping thereof.

In the preferred embodiment of the invention, the elongated housing defines a mother board-mounting face and a daughter board-receiving face. The housing includes a pair of generally parallel slots extending lengthwise thereof in the board-receiving face for receiving a pair of daughter boards. A plurality of the terminal-receiving passages are provided along the housing in proximity to each slot. Each terminal in each passage has a contact section for engaging a circuit on the respective daughter board received in the respective slot. The elongated stiffening bar is disposed within the elongated housing between the pair of slots therein.

As disclosed herein, the elongated stiffening bar is a plate-like member disposed in a plane generally perpendicular to the mother board mounting face. A third slot is provided in the housing at the board-mounting face between the pair of slots in the board-receiving face, for receiving the elongated stiffening bar. The third slot is dimensioned for receiving the stiffening bar by an interference or press fit therewithin such that the housing and the stiffening bar can be conjointly mounted to the mother board. The means for securing the stiffening bar to the mother board are provided by a plurality of securing feet projecting from a bottom edge of the plate-like stiffening bar, for insertion into appropriate securing holes in the mother board.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 3:
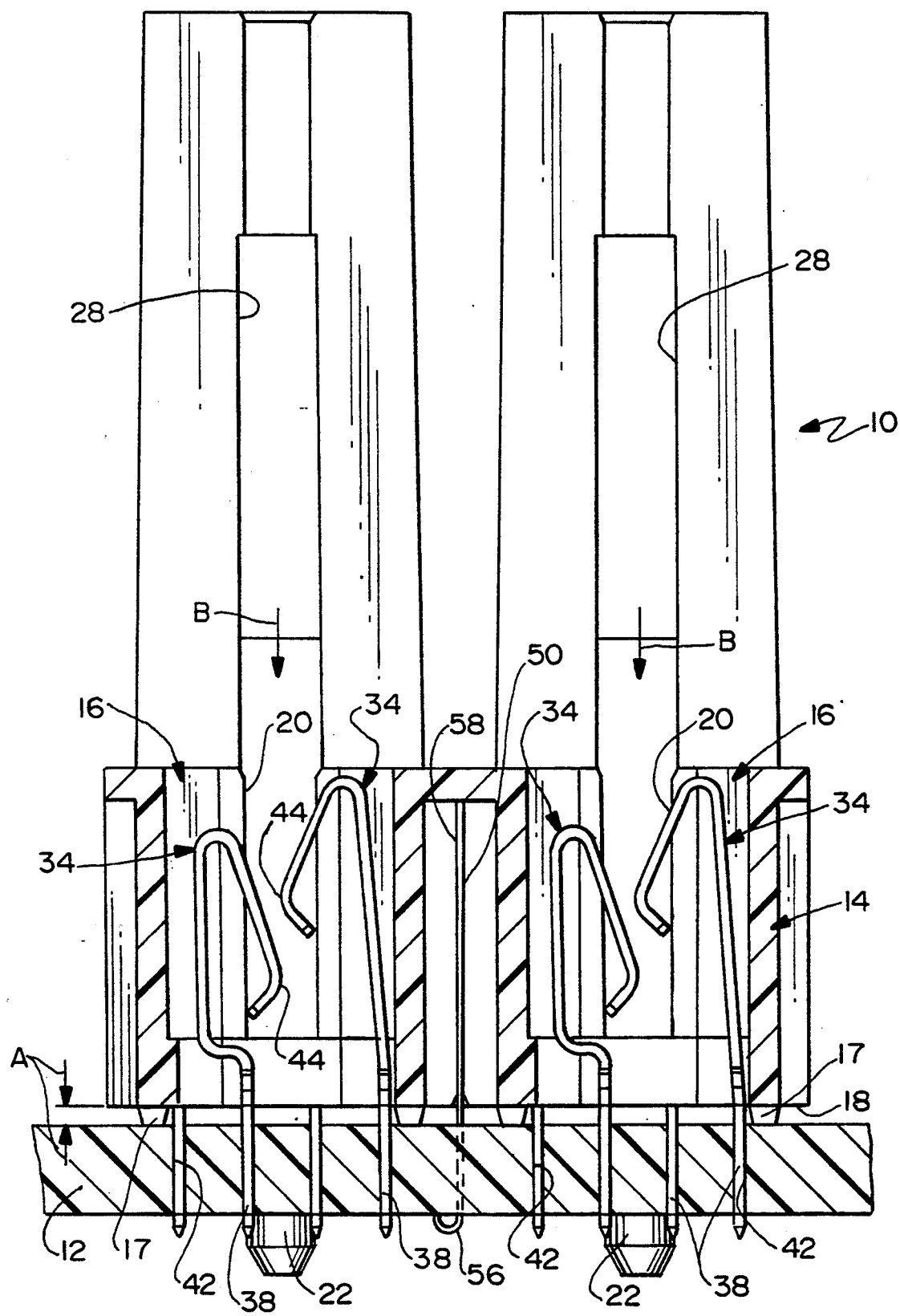
FIG. 3 is a section taken generally along line 3—3 of FIG. 2.

Referring to the drawings in greater detail, the invention is incorporated in an electrical connector, generally designated 10, for mounting on a printed circuit board 12 (FIG. 3). The connector includes an integrally molded, one piece dielectric housing, generally designated 14, having a plurality of terminal-receiving passages, generally designated 16. A plurality of standoffs 17 project from a bottom board-mounting face 18 of the housing toward the printed circuit board to space the housing from the board. The housing is unitarily molded of plastic material, and standoffs 17 are molded integrally therewith. The standoffs provide a spacing, as indicated by arrows "A" in FIG. 3, to allow for cleaning processes, such as wash-through processes, to remove flux and other contaminants after the connector is soldered to printed circuit board 12.

Referring particularly to FIG. 3, housing 14 defines a pair of board-receiving slots 20 for insertion thereinto of a pair of printed circuit boards in the direction of arrows "B". In practice, printed circuit board 12 is considered the "mother" board and the printed circuit boards (not shown) which are inserted into slots 20 are considered "daughter" boards. FIG. 3 also shows that a plurality of mounting posts 22 project from bottom face 18 of the housing for insertion into appropriate mounting holes in circuit board 12. Like standoffs 17, mounting posts 22 are molded integrally with the housing.

Figure 2:
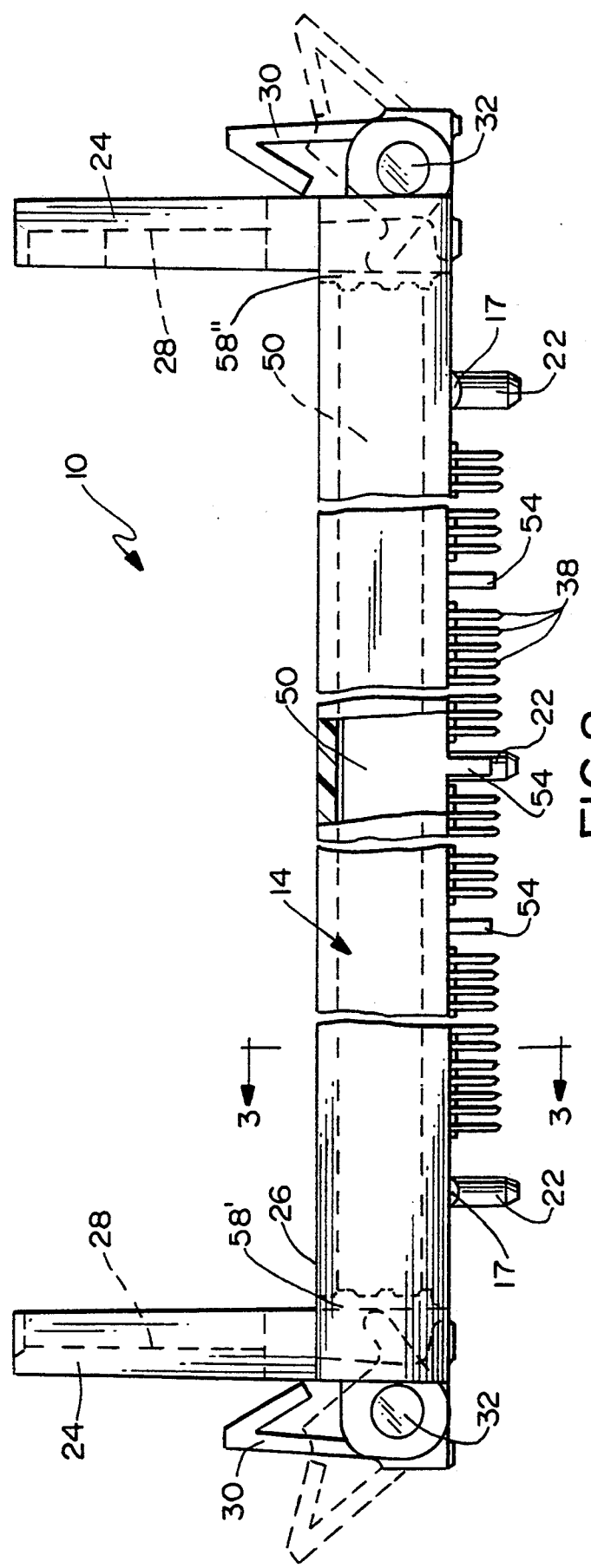
FIG. 2 is a side elevational view of the connector.

Referring specifically to FIG. 2, it can be seen that housing 14, and thereby connector 10, is considerably elongated. A pair of end posts 24 project upwardly from a top board-receiving face 26 of the housing, and the posts have inwardly directed grooves 28 (also see FIG. 3) for receiving the side edges of the daughter boards when they are inserted into slots 20 in the direction of arrows "B" (FIG. 3). FIG. 2 also shows a pair of ejecting levers 30 pivotally mounted on housing 14, outside posts 24, on pivot means 32. As is known in the art, the ejecting levers facilitate ejecting the daughter boards from board-receiving slots 20 in housing 14.

Figure 1:
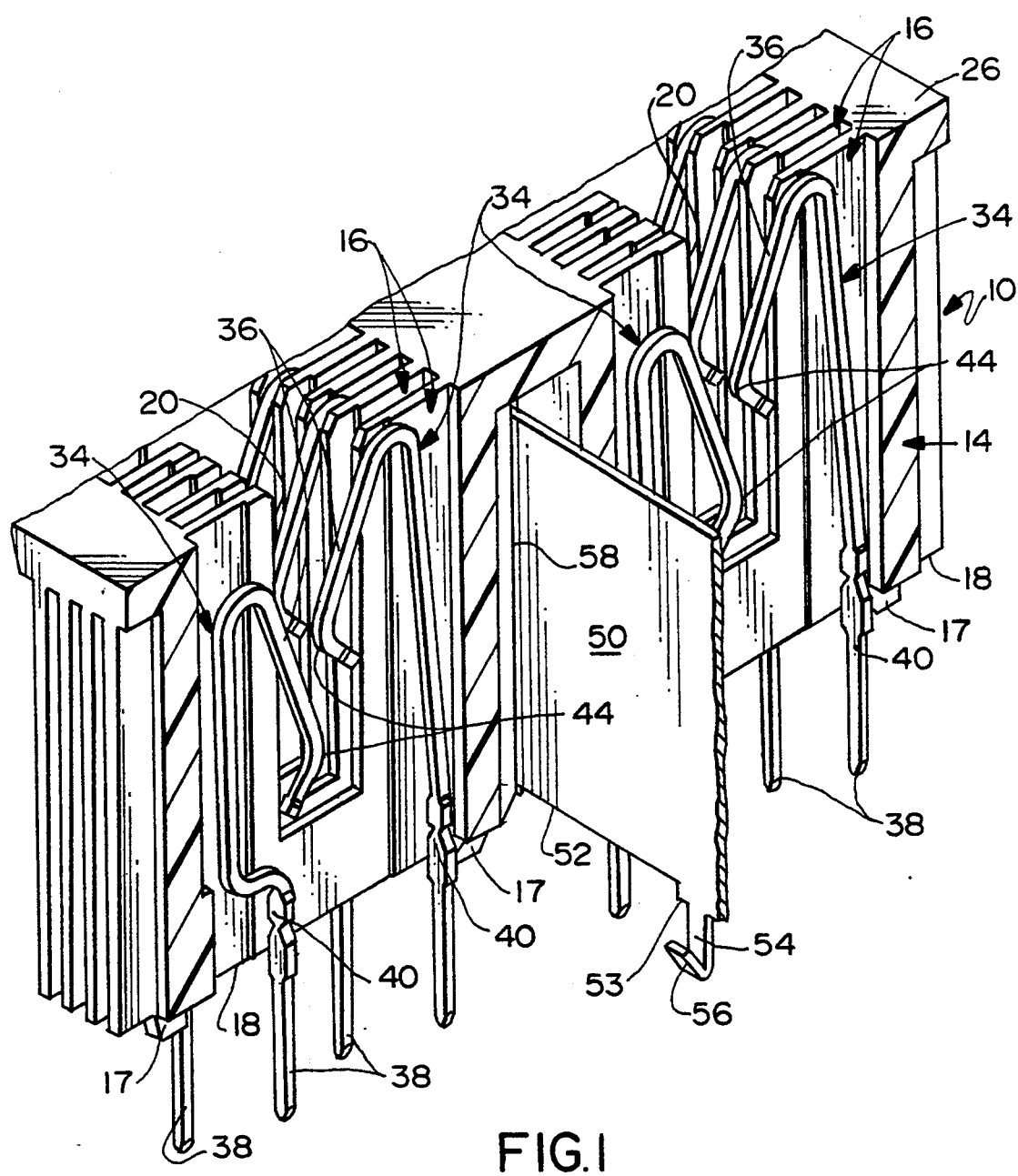
FIG. 1 is a fragmented perspective view of a section through an electrical connector embodying the concepts of the invention.

As best seen in FIGS. 1 and 2, a plurality of terminals, generally designated 34, are received in terminal-receiving passages 16. Each terminal includes a contact beam section 36 located in housing 14, a tail section 38 projecting from bottom face 18 of the housing, and a retention section 40 between the contact beam and tail sections.

The retention sections of the terminals are wider, in a direction transversely of passages 16, than the contact beam sections and the tail sections. The tail sections are provided as straight solder tails for insertion into holes 42 (FIG. 3) in circuit board 12 for soldering to circuit traces on the board and/or in the holes. The contact beam sections of the terminals are formed into reversely bent or semi-bellows configurations to define spring contact arms having contact areas 44 for engaging circuit pads on opposite sides of the daughter boards inserted into board-receiving slots 20.

The board stiffening system of the invention is embodied in an elongated stiffening bar 50 in the form of a long plate-like member disposed in a plane generally perpendicular to printed circuit board 12 and board mounting face 18. The stiffening bar may be fabricated of sheet metal material. The bar includes a straight bottom edge 52 positioned adjacent the top surface 13 of printed circuit board 12 so that, when the stiffening bar is secured to the board, the bar maintains the board to prevent warpage or bending. Additional standoffs 53 may be integrally stamped along the bottom edge 52 of bar 50 that contact the top surface 13 of board 12 and serve the same function as standoffs 17 on the housing. In addition, a flange perpendicular to the plane of bar 50 may extend along a substantial portion of the length of the bar to add additional rigidity.

Various means may be provided for securing stiffening bar 50 to printed circuit board 12 to prevent the aforementioned warpage thereof. More particularly, a plurality of feet 54 project downwardly from edge 52 of the stiffening bar for insertion into appropriate securing holes in the printed circuit board. The feet are shown as having upwardly turned hook portions 56 which are configured to engage the opposite side of the printed circuit board. With the stiffening bar being fabricated of sheet metal material, the configurations of the hook portions of the feet can be slightly wider than the securing holes in the printed circuit board, so that the hooked portions snappingly engage the opposite side of the board when the feet are inserted into the holes. The bar could also utilize straight tails that are clinched upon insertion into the board 12 or have barbs that are press fit into holes in the board.

As best seen in FIG. 3, housing 14 is provided with a narrow slot 58 running lengthwise of the housing from the bottom of the housing 14 and into which the plate-like stiffening bar 50 is positionable. Such slot could also open from the top of the housing to permit top loading of bar 50. Various manners of securing the stiffening bar 50 within slot 58 are contemplated. For example, the length of bar 50 could be slightly longer than the length of slot 58 to create an interference at ends 58' and 58" of the slot (FIG. 2). In the alternative, the width of slot 58 could be dimensioned relative to the thickness of the stiffening bar to provide an interference or press fit between the bar and the inside walls of the slot in order to self-support the stiffening bar within housing 14. Such interference could also be created by projections on the housing or the bar. Regardless of the manner of securement, the bar is inserted during the assembly of the connector so that during the manufacture or assembly of electrical connector 10, the entire connector assembly, including the stiffening bar, can be mounted on printed circuit board 12 in a single mounting step or operation. This eliminates the need for the separate mounting steps for the stiffener and the connector as is required with separate stiffening devices of the prior art, as outlined in the "Background" above.

In addition, it can be seen that stiffening bar 50 is located entirely within the bounds of connector housing 14. Therefore, the board stiffening system of the invention does not require any additional "real estate" whatsoever on the printed circuit board.

Still further, there is a continuing demand to reduce the overall height of connectors or other components mounted on printed circuit boards. Obviously, stiffening bar 50 must be of a substantial height perpendicular to the board in order to provide adequate stiffening of the printed circuit board, particularly in considerably elongated connector assemblies as shown in FIG. 2. With the stiffening system of the invention, particularly as seen in FIG. 3, stiffening bar 50 and its slot 58 in housing 14 are located between slots 20 which receive the daughter boards. As can be seen in FIGS. 1 and 3, slot 58 extends from bottom face 18 of the connector housing substantially entirely to the top face of the housing. This allows stiffening bar 50 to be of a maximum width within the confines of the connector assembly.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

I claim:

1. In an edge card receiving electrical connector assembly for mounting on a printed circuit board, the connector assembly including
    an elongated, integrally formed, one-piece insulative housing having a generally planar mother board-mounting face and a daughter board receiving face, the housing including a pair of generally parallel slots extending lengthwise thereof in the board-receiving face for receiving a pair of daughter boards, a plurality of terminal-receiving passages along the housing in proximity to each slot, and
    a plurality of terminals received in said passages, each terminal having a contact section for engaging a circuit on the respective daughter board upon insertion of the board in the respective slot,
    wherein the improvement comprises a mother board stiffening system including
    a generally planar elongated stiffening bar disposed within the elongated housing between the pair of slots therein, the bar extending substantially the entire length of the housing and being rigid in a direction generally perpendicular to the mother board mounting face of the housing, and
    means for securing the stiffening bar to the mother board to prevent warping thereof.

2. In an electrical connector assembly as set forth in claim 1, wherein said elongated stiffening bar comprises a plate-like member disposed in a plane generally perpendicular to the mother board mounting face.

3. In an electrical connector assembly as set forth in claim 2, wherein said housing includes a third slot, said third slot being positioned in the board-mounting face of the housing between said pair of slots in the board-receiving face of the housing for accepting the elongated stiffening bar.

4. In an electrical connector assembly as set forth in claim 3, wherein said third slot is dimensioned for receiving the stiffening bar by an interference fit therewithin such that the housing and the stiffening bar can be conjointly mounted to the mother board.

5. In an electrical connector assembly as set forth in claim 4, wherein said stiffening bar is taller than the distance from said mother board mounting face to the bottom of said pair of daughter board receiving slots.

6. In an electrical connector assembly as set forth in claim 1, wherein said means for securing the stiffening bar to the mother board comprise a plurality of securing feet on the bar spaced lengthwise thereof.

7. In an electrical connector assembly as set forth in claim 1, wherein said housing includes a third slot, said third slot being positioned in the board-mounting face of the housing between said pair of slots in the board-receiving face of the housing for accepting the elongated stiffening bar.

8. In an electrical connector assembly as set forth in claim 7, wherein said third slot is dimensioned for receiving the stiffening bar by an interference fit therewithin such that the housing and the stiffening bar can be conjointly mounted to the mother board.

9. In an electrical connector assembly as set forth in claim 1, wherein said stiffening bar is taller than the distance from said mother board mounting face to the bottom of said pair of daughter board receiving slots.

10. In an electrical connector assembly as set forth in claim 1, wherein said elongated stiffening bar comprises a sheet metal member and said means for securing the stiffening bar to the mother board comprise a plurality of feet projecting from a lower edge thereof for insertion into appropriate holes in the mother board.

11. In an electrical connector assembly as set forth in claim 10, wherein said feet are formed with hooks for engaging a side of the mother board opposite a side thereof to which the connector assembly is mounted.

12. In an electrical connector assembly for mounting on a printed circuit board, the connector assembly including
    an elongated, dielectric housing having a mother board mounting face and a daughter board receiving face, the housing including a pair of generally parallel board receiving slots extending lengthwise thereof in the board receiving face for receiving a pair of daughter boards, a plurality of terminal receiving passages along the housing in proximity to each board receiving slot, and
    a plurality of terminals received in said passages, each terminal having a contact section for engaging a circuit on the respective daughter board upon insertion of the board in the respective board receiving slot, wherein the improvement comprises a mother board stiffening system including:

a stiffener receiving slot in said housing generally equidistantly spaced between said board receiving slots, an elongated stiffening bar disposed within the stiffener receiving slot, the bar extending substantially the entire length of the housing and being rigid in a direction generally perpendicular to the mother board mounting face of the housing, means for securing said board stiffening bar within said stiffener receiving slot, and means for securing the stiffening bar to the mother board to prevent warping thereof.

13. In an electrical connector assembly as set forth in claim 12, wherein said elongated stiffening bar comprises a plate-like member disposed in a plane generally perpendicular to the mother board mounting face.

14. In an electrical connector assembly as set forth in claim 12, wherein said daughter board receiving slots include a bottom surface and the portion of said stiffening bar within said housing is taller than the distance from said mother board mounting face to the bottom surface of said pair of daughter board receiving slots.

15. In an electrical connector assembly as set forth in claim 14, wherein said stiffener receiving slot is dimensioned for receiving the stiffening bar by an interference fit therewithin such that the housing and the stiffening bar can be conjointly mounted to the mother board.

16. In an electrical connector assembly as set forth in claim 12, wherein said stiffener receiving slot extends upward from said mother board mounting face.

17. In an electrical connector assembly as set forth in claim 16, wherein said daughter board receiving slots include a bottom surface and the portion of said stiffening bar within said housing is taller than the distance from said mother board mounting face to the bottom surface of said pair of daughter board receiving slots.

18. In an electrical connector assembly as set forth in claim 17, wherein said stiffener receiving slot is dimensioned for receiving the stiffening bar by an interference fit therewithin such that the housing and the stiffening bar can be conjointly mounted to the mother board.

19. In an electrical connector assembly as set forth in claim 12, wherein said elongated stiffening bar comprises a sheet metal member, and said means for securing the stiffening bar to the mother board comprise a plurality of feet projecting from a lower surface thereof for insertion into appropriate holes in the mother board.

* * * * *